United States Patent
Lin et al.

(10) Patent No.: US 10,204,843 B2
(45) Date of Patent: Feb. 12, 2019

(54) INTERCONNECT ARRANGEMENT WITH STRESS-REDUCING STRUCTURE AND METHOD OF FABRICATING THE SAME

(71) Applicant: Taiwan Semiconductor Manufacturing Co., Ltd., Hsinchu (TW)

(72) Inventors: Yi-Ruei Lin, Taipei (TW); Yen-Ming Peng, Taoyuan County (TW); Han-Wei Yang, Hsinchu (TW); Chen-Chung Lai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/808,184

(22) Filed: Nov. 9, 2017

(65) Prior Publication Data

US 2018/0076109 A1    Mar. 15, 2018

Related U.S. Application Data

(63) Continuation of application No. 15/295,043, filed on Oct. 17, 2016, now Pat. No. 9,818,666, which is a
(Continued)

(51) Int. Cl.
*H01L 23/528* (2006.01)
*H01L 23/31* (2006.01)
(Continued)

(52) U.S. Cl.
CPC .... *H01L 23/3192* (2013.01); *H01L 21/76801* (2013.01); *H01L 21/76808* (2013.01);
(Continued)

(58) Field of Classification Search
CPC .............. H01L 23/3192; H01L 23/528; H01L 23/3171; H01L 23/5226; H01L 23/53295;
(Continued)

(56) References Cited

U.S. PATENT DOCUMENTS

2006/0278989 A1    12/2006  Trezza
2010/0273319 A1    10/2010  Mikami et al.
(Continued)

FOREIGN PATENT DOCUMENTS

KR    10-2011-0025526    3/2011

OTHER PUBLICATIONS

C.-J. Weng, "Novel Approach of Semiconductor Manufacturing Process on Copper Dual Damascene Processes Integration" Jun. 2009. Strain, vol. 45, pp. 221-231.

*Primary Examiner* — Kyoung Lee
(74) *Attorney, Agent, or Firm* — Birch, Stewart, Kolasch & Birch, LLP (57) ABSTRACT

A semiconductor device structure and a method of fabricating the same are provided. The method for manufacturing a semiconductor structure includes forming a dielectric layer over a substrate and forming a first structure through the dielectric layer such that a first portion of the dielectric layer is disposed in between the first structure. The method for manufacturing a semiconductor structure further includes forming a first via hole and a second via hole through the first portion of the dielectric layer and forming a trench connecting the first via hole and the second via hole in the dielectric layer. The method for manufacturing a semiconductor structure further includes forming a conductive feature in the first via hole, the second via hole, and the trench. In addition, the first structure and the dielectric layer are made of different materials from each other.

20 Claims, 11 Drawing Sheets

Related U.S. Application Data continuation of application No. 14/987,429, filed on Jan. 4, 2016, now Pat. No. 9,472,508, which is a continuation of application No. 14/162,158, filed on Jan. 23, 2014, now Pat. No. 9,252,047.

(51) Int. Cl.
| | | |
|---|---|---|
| *H01L 23/48* | (2006.01) | |
| *H01L 21/768* | (2006.01) | |
| *H01L 23/00* | (2006.01) | |
| *H01L 23/532* | (2006.01) | |
| *H01L 23/522* | (2006.01) | |

(52) U.S. Cl.
CPC .. *H01L 21/76822* (2013.01); *H01L 21/76877* (2013.01); *H01L 23/3171* (2013.01); *H01L 23/3178* (2013.01); *H01L 23/481* (2013.01); *H01L 23/528* (2013.01); *H01L 23/5226* (2013.01); *H01L 23/53295* (2013.01); *H01L 23/562* (2013.01); *H01L 2924/0002* (2013.01)

(58) Field of Classification Search
CPC ......... H01L 21/76801; H01L 21/76808; H01L 23/3178; H01L 23/562; H01L 21/76877; H01L 23/481; H01L 21/76822; H01L 2924/0002

See application file for complete search history.

(56) References Cited

U.S. PATENT DOCUMENTS

| | | |
|---|---|---|
| 2011/0057297 A1 | 3/2011 | Lee et al. |
| 2012/0199984 A1 | 8/2012 | Fujita et al. |
| 2012/0248581 A1* | 10/2012 | Sugiyama ......... H01L 21/76898 257/622 |
| 2013/0270712 A1 | 10/2013 | Chen et al. |
| 2013/0334669 A1 | 12/2013 | Kuo et al. |

* cited by examiner

INTERCONNECT ARRANGEMENT WITH STRESS-REDUCING STRUCTURE AND METHOD OF FABRICATING THE SAME

CROSS REFERENCE TO RELATED APPLICATIONS

This application is a Continuation application of U.S. patent application Ser. No. 15/295,043, filed on Oct. 17, 2016, which is a Continuation application of U.S. patent application Ser. No. 14/987,429, filed on Jan. 4, 2016, which is a Continuation application of U.S. patent application Ser. No. 14/162,158, filed on Jan. 23, 2014, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. As feature densities in the semiconductor devices increase, the widths of the conductive lines, and the spacing between the conductive lines of back-end of line (BEOL) interconnect structures in the semiconductor devices also need to be scaled down.

However, although existing methods for forming interconnect structures have been generally adequate for their intended purposes, as device scaling-down continues, they have not been entirely satisfactory in all respects.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments of a semiconductor device structure and a method for fabricating the same are provided in accordance with some embodiments of the disclosure. The semiconductor device structure may include an interconnect structure having a conductive feature formed in a dielectric layer.

Figure 1:
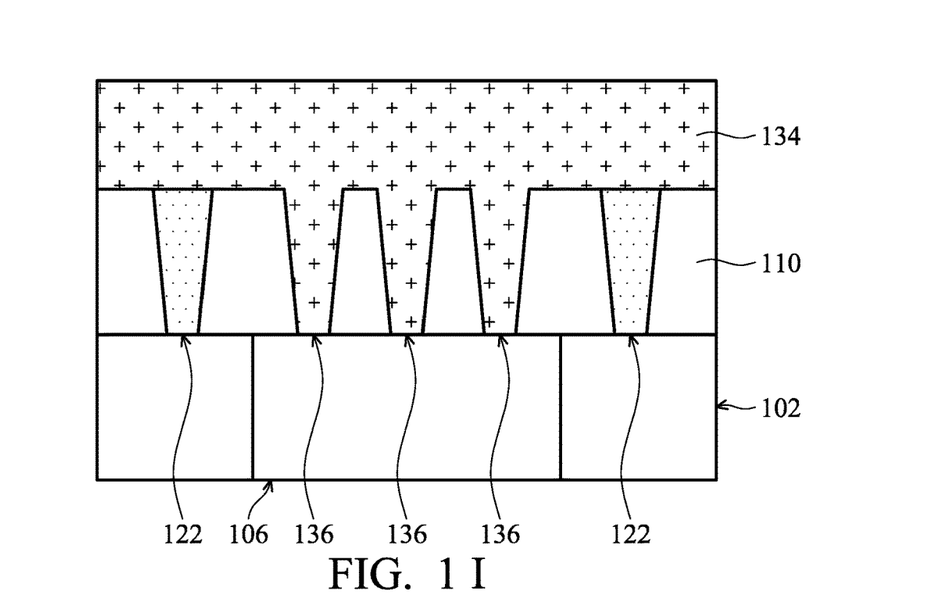
Figure 1A:
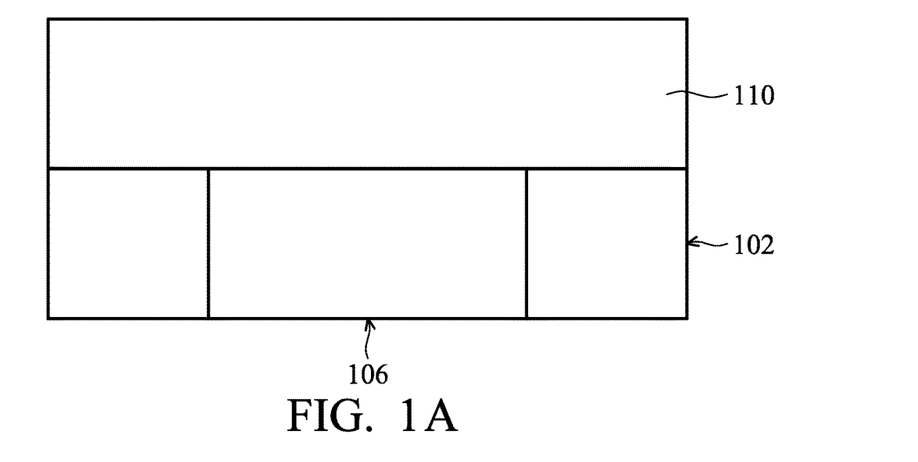
FIGS. 1A-1N are cross-sectional representations of various stages of forming a semiconductor device structure in accordance with some embodiments.
Figure 1B:
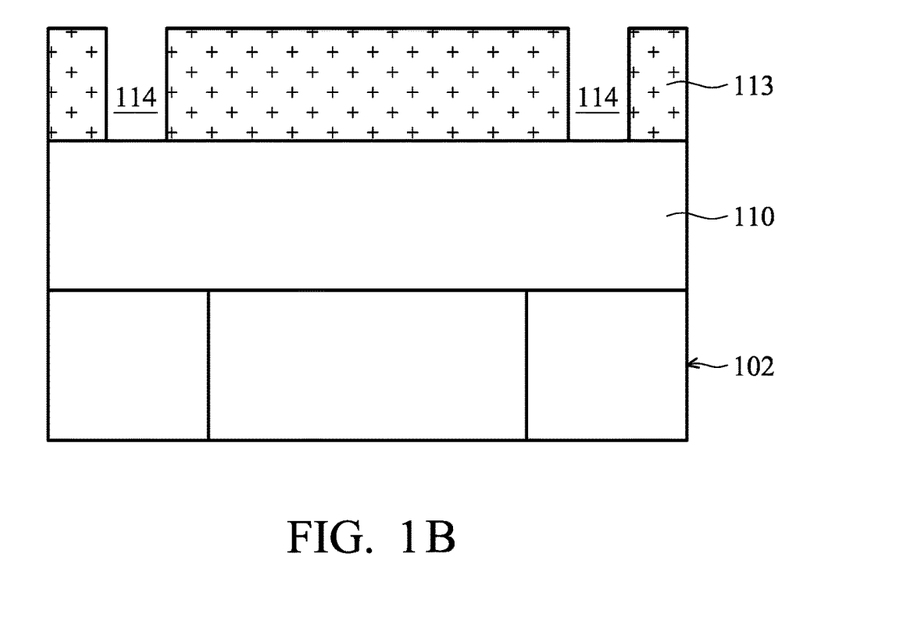
Figure 1C:
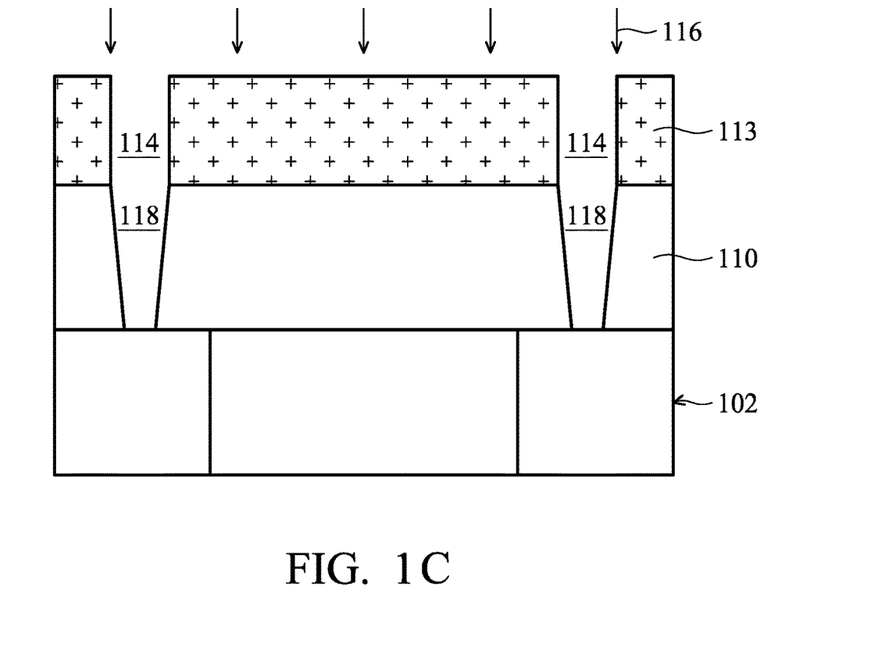
Figure 1D:
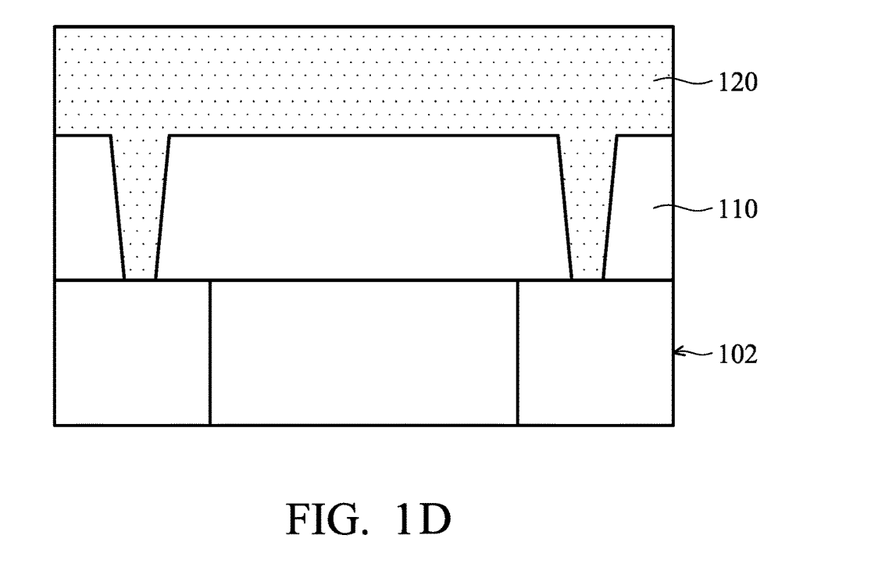
Figure 1E:
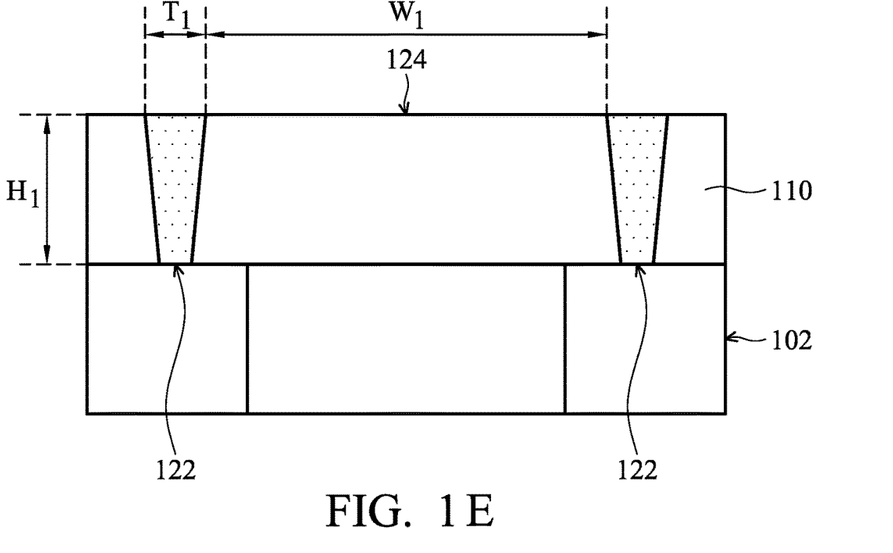
Figure 1F:
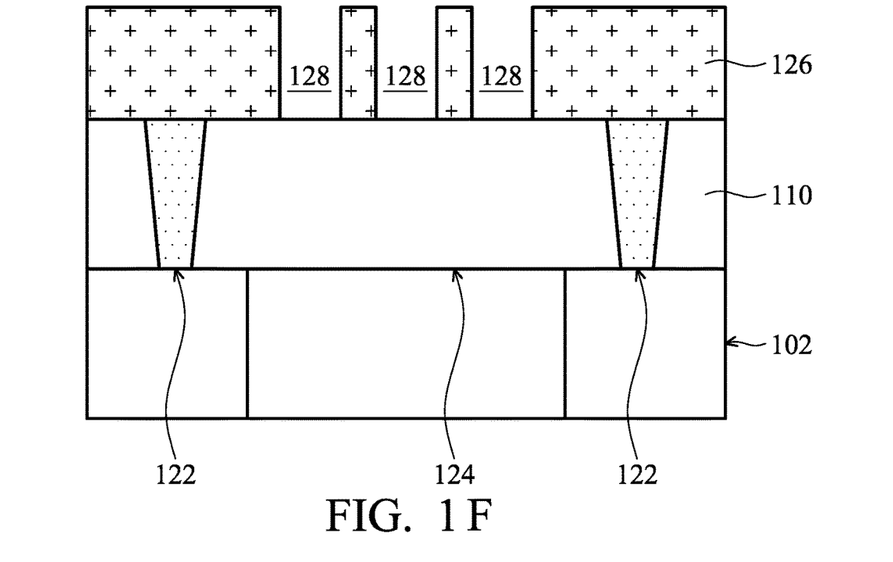
Figure 1G:
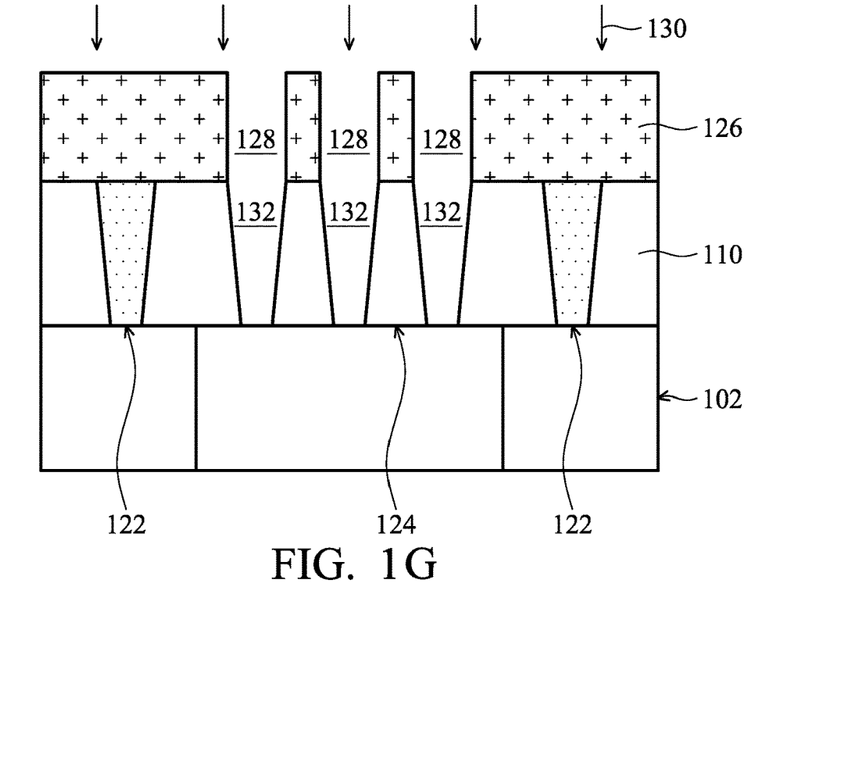
Figure 1H:
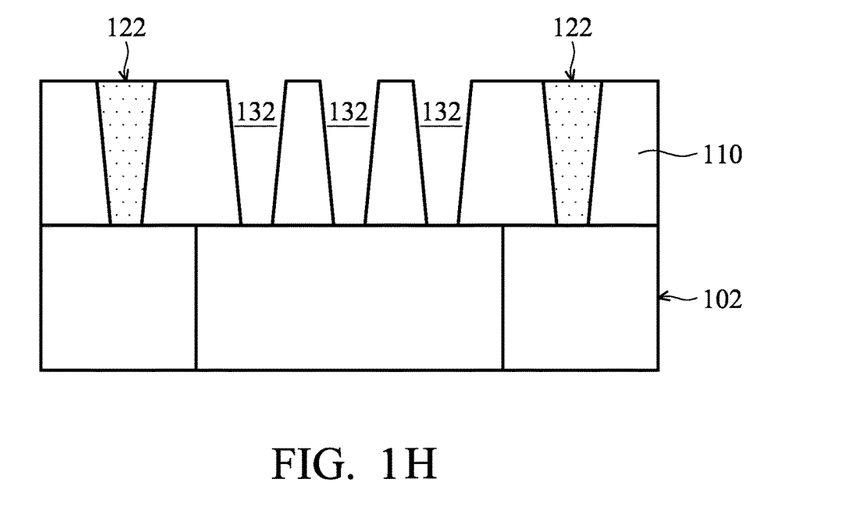
Figure 1K:
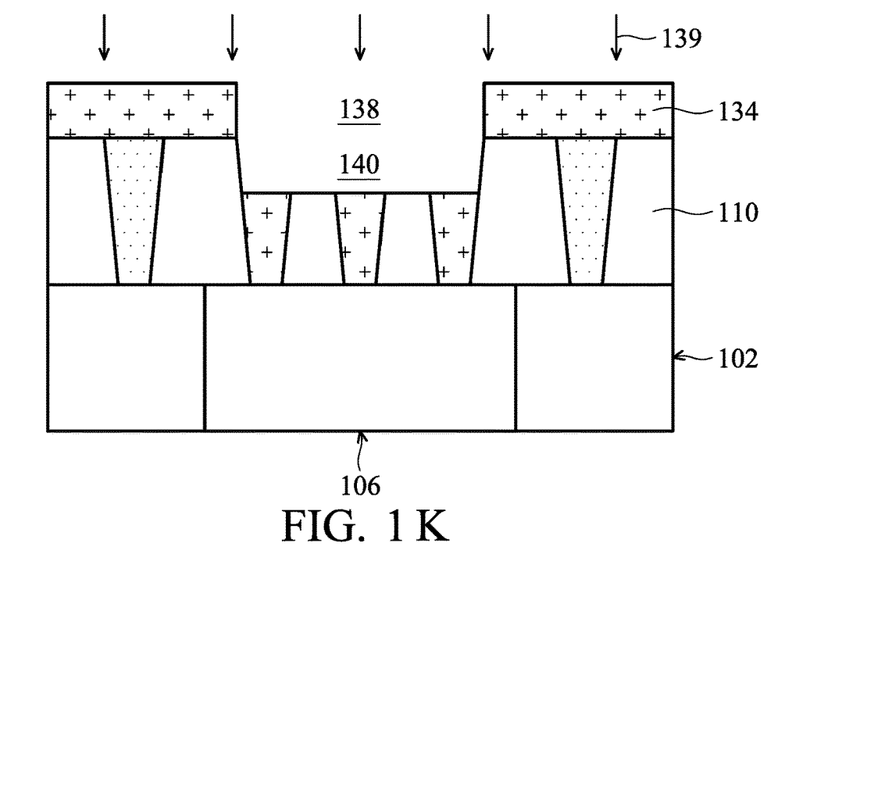
Figure 1L:
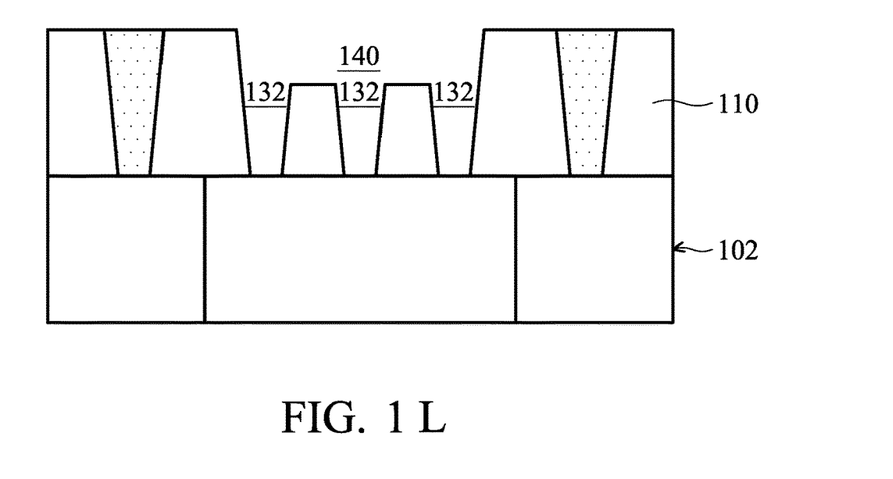
Figure 1M:
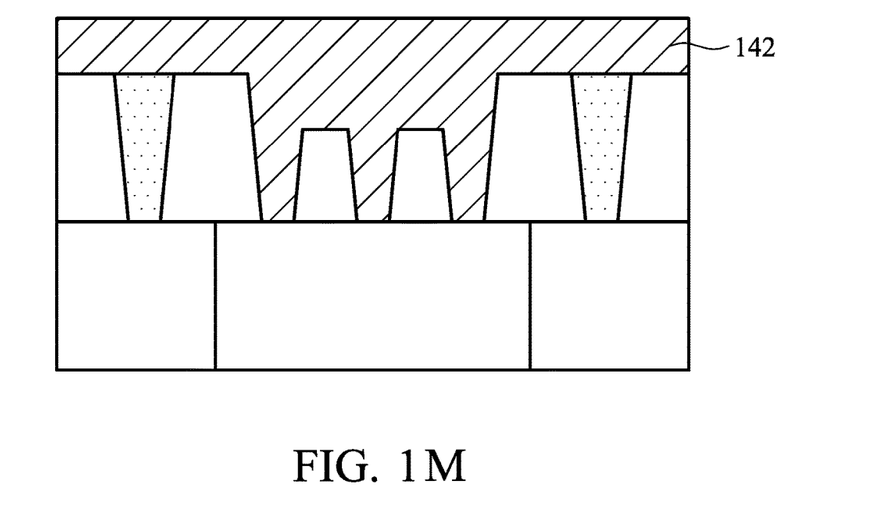
Figure 1N:
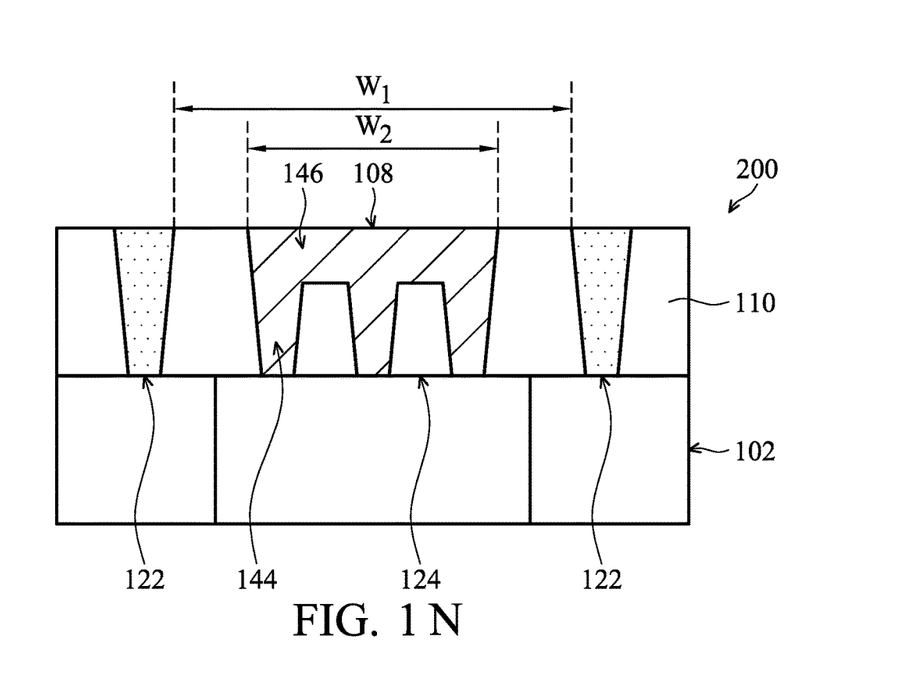

FIGS. 1A-1N illustrate cross-sectional representations of various stages of forming a semiconductor device structure 100 in accordance with some embodiments. As shown in FIG. 1A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

Substrate 102 includes device region 106, as shown in FIG. 1A in accordance with some embodiments. Device region 106 may have various device elements. Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and/or other applicable processes. In some embodiments, device region 106 is formed in substrate 102 in a front-end-of-line (FEOL) process.

A dielectric layer 110 is formed over substrate 102, as shown in FIG. 1A in accordance with some embodiments. In some embodiments, dielectric layer 110 is an inter-metal dielectric (IMD) layer. Dielectric layer 110 may include multilayers made of multiple dielectric materials, such as a low dielectric constant or an extreme low dielectric constant (ELK) material. Examples of the dielectric materials may include, but are not limited to, oxide, $SiO_2$, borophosphosilicate glass (BPSG), tetraethyl orthosilicate (TEOS), spin on glass (SOG), undoped silicate glass (USG), fluorinated silicate glass (FSG), high-density plasma (HDP) oxide, or plasma-enhanced TEOS (PETEOS). Dielectric layer 110 may be formed by chemical vapor deposition (CVD), physical vapor deposition, (PVD), atomic layer deposition (ALD), spin-on coating, or other applicable processes.

A first photoresist layer 113 is formed over dielectric layer 110, and first photoresist layer 113 includes one or more opening 114, as shown in FIG. 1B in accordance with some embodiments. The shape of opening 114 may be adjusted as required. In some embodiments, opening 114 has a shape that is an enclosed or non-enclosed circle, rectangle, ellipse, square, or polygon, when viewed from a top view or above (not shown). In some embodiments, opening 114 includes an n-shaped structure, T-shaped structure, bar-shaped structure, and/or a linear structure, when viewed from a top view or above (not shown).

After first photoresist layer 113 is formed, an etching process 116 is performed to etch dielectric layer 110 through opening 114, as shown in FIG. 1C in accordance with some embodiments. A stress-reducing structure trench 118 is formed in dielectric layer 110 by etching process 116. Etching process 116 may be a wet etching process or a dry etching process.

After etching process 116 is performed, first photoresist layer 113 is removed, and a stress-relieving material 120 is provided to fill in stress-reducing structure trench 118, as shown in FIG. 1D in accordance with some embodiments. Stress-relieving material 120 is deposited and forms a stress-relieving or stress-reducing guard ring or structure to block or prevent stress forces from acting on the conductive feature formed in sequential processes.

In some embodiment, stress-relieving material 120 is a material different from the material used to form dielectric layer 110. Therefore, stress-relieving material 120 is capable of stopping stress caused by dielectric layer 110 from reaching conductive feature 108. In some embodiments, dielectric layer 110 is made of a compressive material such as $SiO_2$, and stress-relieving material 120 is a tensile material such as $Si_3N_4$.

In some embodiment, stress-relieving material 120 is silicon oxide, silicon nitride, silicon oxynitride, or a combination thereof. In some embodiment, stress-relieving material 120 is $Si_xO_y$, and x:y is in a range from about 0.1 to about 10. In some embodiment, stress-relieving material 120 is $Si_xN_y$, and x:y is in a range from about 0.1 to about 10. In some embodiment, stress-relieving material 120 is $Si_xO_yN_z$, and x:y is in a range from about 0.1 to about 10, or y:z is in a range from about 0.1 to about 10, or x:z is in a range from about 0.1 to about 10. X, y, and z may be adjusted to control the property of stress-relieving material 120.

Stress-relieving material 120 may be formed or deposited by chemical vapor deposition (CVD), physical vapor deposition (PVD), atomic layer deposition (ALD), high density plasma CVD (HDPCVD), metal organic CVD (MOCVD), plasma enhanced CVD (PECVD), or other applicable deposition processes.

After stress-relieving material 120 fills or is deposited in stress-reducing structure trench 118, excess portion of stress-relieving material 120 is removed to expose a top surface of dielectric layer 110, as shown in FIG. 1E in accordance with some embodiments. The excess portion of stress-relieving material 120 may be removed by a chemical mechanical polishing (CMP) process.

A stress-reducing structure 122 includes stress-reducing structure trench 118. The shape of stress-reducing structure 122 may be similar to or the same as the shape of opening 114 of first photoresist layer 113. Although it is not shown in the cross-section representation illustrated in FIG. 1E, in some embodiments, stress-reducing structure 122 has a shape that is an enclosed or non-enclosed circle, rectangle, ellipse, square, or polygon, when viewed from a top view or above. In some embodiments, stress-reducing structure 122 includes an n-shaped structure, T-shaped structure, bar-shaped structure, and/or a linear structure. It should be noted that stress-reducing structure 122 may include a plurality of portions having the same or different shapes, and some of the portions may intersect with each other, while some of the portions may not intersect with each other.

In some embodiments, stress-reducing structure 122 has a height $H_1$ in a range from about 0.09 µm to about 35 µm. In some embodiments, stress-reducing structure 122 has a thickness $T_1$ in a range from about 0.09 µm to about 3 µm.

In addition, as shown in FIG. 1E, a portion 124 of dielectric layer 110 is surrounded by stress-reducing structure 122 in accordance with some embodiments. Stress-reducing structure 122 is configured to prevent the stress caused or created by dielectric layer 110 from directly entering or acting on portion 124. Therefore, features formed in portion 124 of dielectric layer 110 are protected by stress-reducing structure 122. In some embodiments, portion 124 of dielectric layer 110 has a width $W_1$ in a range from about 0.01 µm to about 50 µm.

After stress-reducing structure 122 is formed, conductive feature 108 is formed in portion 124 of dielectric layer 110 surrounded by stress-reducing structure 122 in accordance with some embodiments. As shown in FIG. 1F, a second photoresist layer 126 is formed over dielectric layer 110 in accordance with some embodiments. Second photoresist layer 126 includes openings 128 over portion 124 of dielectric layer 110. It should be noted that although three openings 128 are illustrated in FIG. 1F, the number of openings 128 in second photoresist layer 126 is not intended to be limiting. For example, second photoresist layer 126 may only include one opening.

Next, an etching process 130 is performed through openings 128, and via holes 132 are formed in portion 124 of dielectric layer 110, as shown in FIG. 1G in accordance with some embodiments. Second photoresist layer 126 is removed after via holes 132 are formed, as shown in FIG. 1H in accordance with some embodiments.

After second photoresist layer 126 is removed, a third photoresist layer 134 is formed over substrate 102 to cover dielectric layer 110 and stress-reducing structure 122, as shown in FIG. 1I in accordance with some embodiments. In addition, portions 136 of third photoresist layer 134 fill in via holes 132.

Next, an opening 138 is formed in third photoresist layer 134, as shown in FIG. 1J in accordance with some embodiments. Opening 138 exposes portions 136 of third photoresist layer 134 formed in via holes 132 and some portions of dielectric layer surrounded (e.g. enclosed) by stress-reducing structure 122. In some embodiments, opening 138 is formed by an exposure process and a developing process.

After opening 138 of third photoresist layer 134 is formed, an etching process 140 is performed through opening 138 to form a trench 140, as shown in FIG. 1K in accordance with some embodiments. More specifically, top portions of portion 136 formed in via holes 132 and top portions of dielectric layer 110 exposed by opening 138 are removed.

After trench 140 is formed, remaining portions of third photoresist layer 134, including those in via holes 132, are removed, as shown in FIG. 1L in accordance with some embodiments. As shown in FIG. 1L, trench 140 is formed over via holes 132 and is directly connected with via holes 132.

Next, a conductive material 142 is formed over substrate 102 to fill in trench 140 and via holes 132, as shown in FIG. 1M in accordance with some embodiments. Conductive material 142 may be a highly-conductive metal, low-resistive metal, elemental metal, transition metal, or the like. Examples of conductive material 142 may include, but are not limited to, copper (Cu), aluminum (Al), tungsten (W), titanium (Ti), gold (Au), or tantalum (Ta).

After conductive material 142 is formed, a CMP process is performed to form conductive feature 108, as shown in FIG. 1N in accordance with some embodiments. In some embodiments, the top surface of stress-reducing structure 122 is substantially level with the top surface of conductive feature 108. In some embodiments, the top surface of stress-reducing structure 122 is substantially level with the top surface of the conductive feature, and the bottom surface of stress-reducing structure 122 is substantially level with the bottom surface of the conductive feature.

As shown in FIG. 1N, conductive feature 108, including vias 144 and a metal line 146, is formed in portion 124 of dielectric layer 110. Metal line 146 is formed in trench 140, and vias 144 in direct contact with metal line 146 are formed in via holes 132.

In some embodiments, conductive feature 108 has a width $W_2$ in a range from about 0.01 μm to about 50 μm. Since conductive feature 108 is formed in portion 124 surrounded by stress-reducing structure 122, width $W_2$ is less than width $W_1$.

Figure 2:
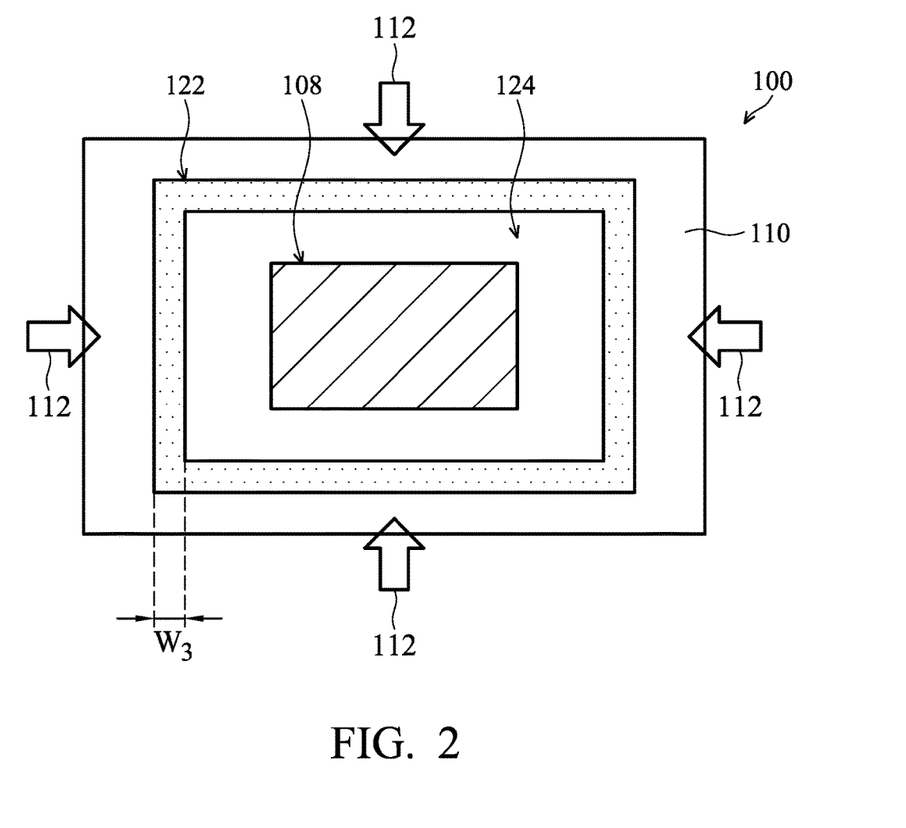
FIG. 2 is a top-view representation of a semiconductor device structure in accordance with some embodiments.

FIG. 2 illustrates a top view representation of semiconductor device structure 100 in accordance with some embodiments. Conductive feature 108 is formed portion 124 of dielectric layer 110 surrounded (or enclosed) by stress-reducing structure 122. As shown in FIG. 2, stress 112 is caused by dielectric layer 110 surrounding conductive feature 108. In addition, stress 112 may be in a direction toward or away from conductive feature 108.

More specifically, stress 112 may be a compressive stress or a tensile stress and may be directed toward or imparted on conductive feature 108. Therefore, if a conductive feature is not surrounded, or protected, by stress-reducing structure 122, the stress may induce or impart undesired forces on conductive feature 108. In addition, the forces may result in a change of electron mobility of the device formed in device region 106 under conductive feature 108. Therefore, the device formed under conductive feature 108 may have poor current uniformity due to stress 112 and the performance of the device may be affected.

Accordingly, conductive feature 108 is formed in portion 124 of dielectric layer 110 surrounded by stress-reducing structure 122, such that stress 112 cannot reach or do not affect conductive feature 108, as shown in FIG. 2 in accordance with some embodiments.

In some embodiments, stress-reducing structure 122 shown in a top view has the shape of a rectangle (but is not limited thereto). In some embodiments, stress-reducing structure 122 has a width $W_3$, and a ratio of the width $W_3$ to width $W_2$ is in a range from about 0.01 to about 2.

It should be noted that although embodiments described above, including embodiments illustrated in FIGS. 1A-1N and FIG. 2, show only one conductive feature formed in one dielectric layer, the semiconductor device structures may include various conductive features in various dielectric layers. That is, the shapes, sizes, and materials of the conductive features may be adjusted depending on their applications, and the scope of the disclosure is not intended to be limiting.

In addition, conductive feature 108 may further include a liner and/or a barrier layer. For example, a liner (not shown) may be formed in trench 140 and via holes 132, and the liner covers the sidewalls and bottom of trench 140 and via holes 132. The liner may be either tetraethylorthosilicate (TEOS) or silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like may, also be used.

Figure 3A:
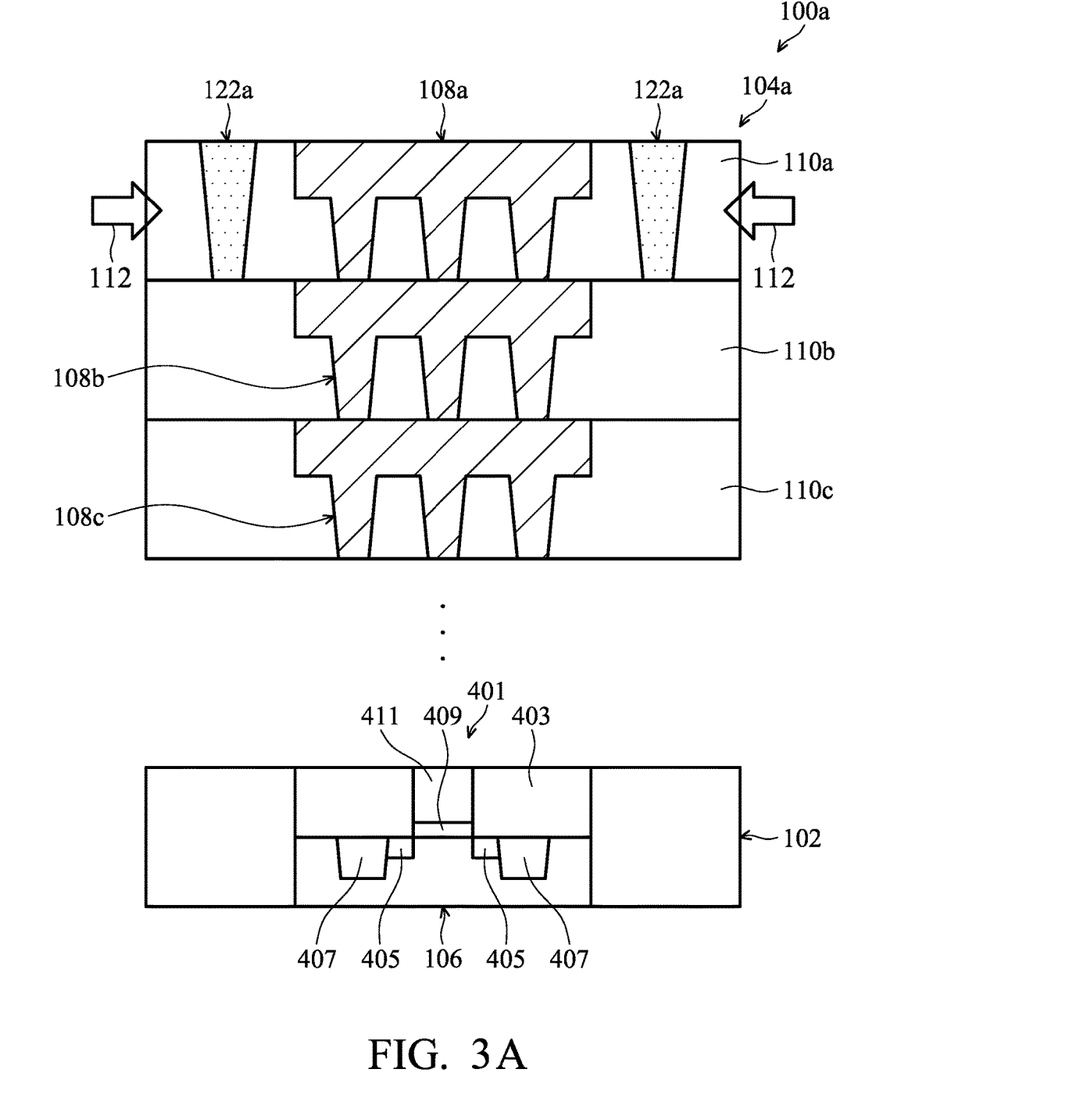
FIGS. 3A-3C are cross-sectional representations of various semiconductor device structures in accordance with various embodiments.

FIG. 3A illustrates a cross-sectional representation of a semiconductor device structure 100a in accordance with some embodiments. A interconnection structure 104a formed in semiconductor device structure 100a includes conductive features, such as conductive features 108a, 108b, and 108c. These conductive features are formed in a number of dielectric layers, such as dielectric layers 110a, 110b, and 110c. In addition, conductive feature 108a is surrounded by a stress-reducing structure 122a formed in dielectric layer 110a.

Moreover, device region 106 formed in substrate 102 includes a gate structure 401 embedded in an interlayer dielectric (ILD) layer 403, source/drain regions 405, and isolation structures 407. Since stress-reducing structure 122 is formed to protect conductive feature 108a from stress 112, performance of gate structure 401 can be unaffected although conductive feature 108a is formed over gate structure 401.

In some embodiments, gate structure 401 includes a gate dielectric layer 409, a gate electrode 411, and spacers (not shown). In some embodiments, gate dielectric layer 409 is made of high k dielectric materials, such as metal oxides, metal nitrides, metal silicates, transition metaloxides, transition metalnitrides, transition metalsilicates, oxynitrides of metals, or metal aluminates. Examples of the dielectric material may include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

In some embodiments, gate electrode 411 is made of a conductive material, such as aluminum, copper, tungsten, titanium, tantulum, titanium nitride, tantalum nitride, nickel silicide, cobalt silicide, TaC, TaSiN, TaCN, TiAl, TiAlN, or other applicable materials.

ILD layer 403 may include multilayers made of multiple dielectric materials, such as silicon oxide, silicon nitride, silicon oxynitride, tetraethoxysilane(TEOS), phosphosilicate glass (PSG), borophosphosilicate glass (BPSG), low-k dielectric material, and/or other applicable dielectric materials. Examples of low-k dielectric materials may include, but are not limited to, fluorinated silica glass (FSG), carbon doped silicon oxide, amorphous fluorinated carbon, parylene, bis-benzocyclobutenes (BCB), or polyimide. ILD layer 403 may be formed by chemical vapor deposition (CVD), physical vapor deposition, (PVD), atomic layer deposition (ALD), spin-on coating, or other applicable processes.

It should be noted that device region 106 shown in FIG. 3A is merely an example, and other devices may be additionally or alternatively formed in device region 106. In addition, some dielectric layers and conductive features are omitted in FIG. 3A for clarity.

Figure 3B:
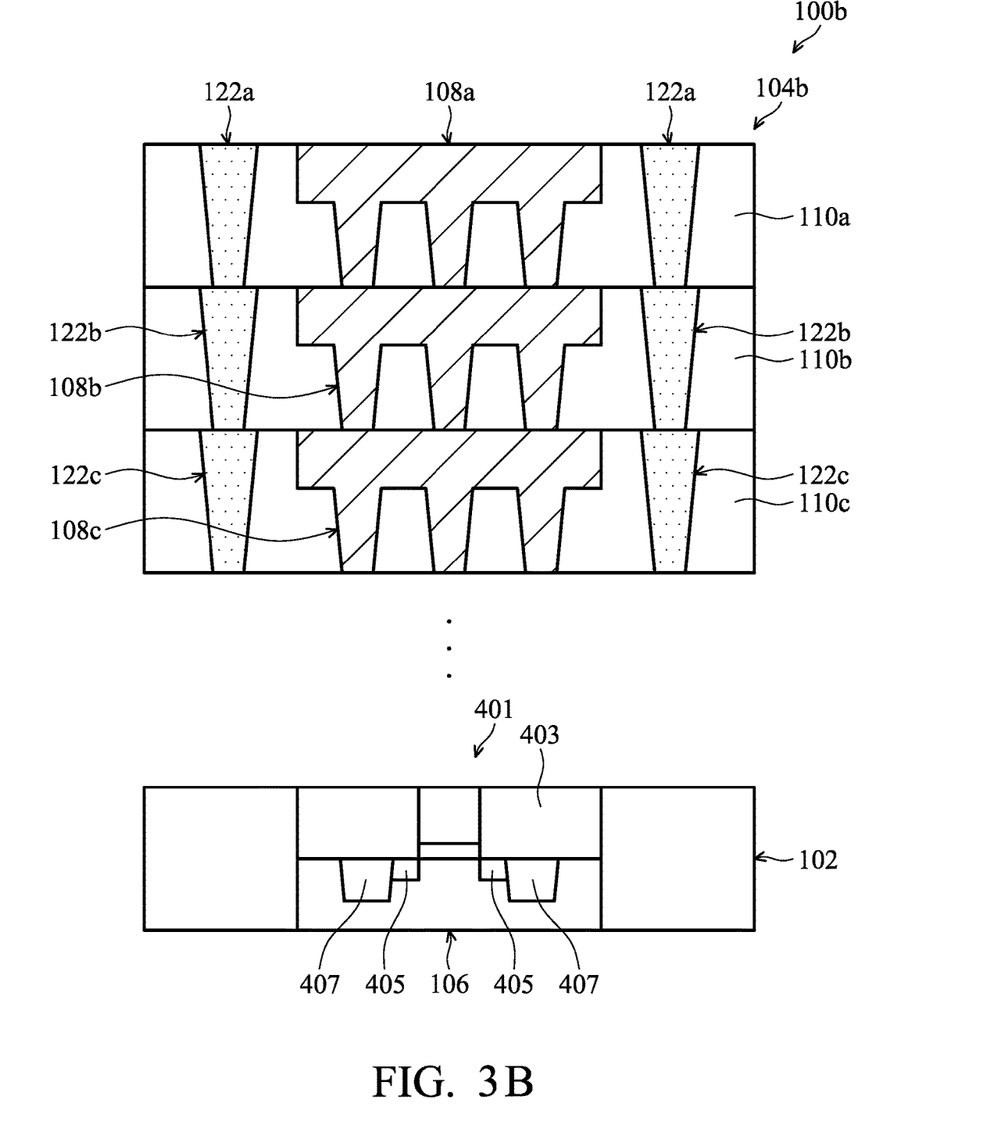

FIG. 3B illustrates a cross-sectional representation of a semiconductor device structure 100b in accordance with some embodiments. Semiconductor device structure 100b is similar to semiconductor device structure 100a except stress-reducing structure 122b and 122c are also formed. More specifically, stress-reducing structure 122b is formed in a dielectric layer 110b to protect conductive feature 108b, and stress-reducing structure 122c is formed in a dielectric layer 110c to protect conductive feature 108c.

Figure 3C:
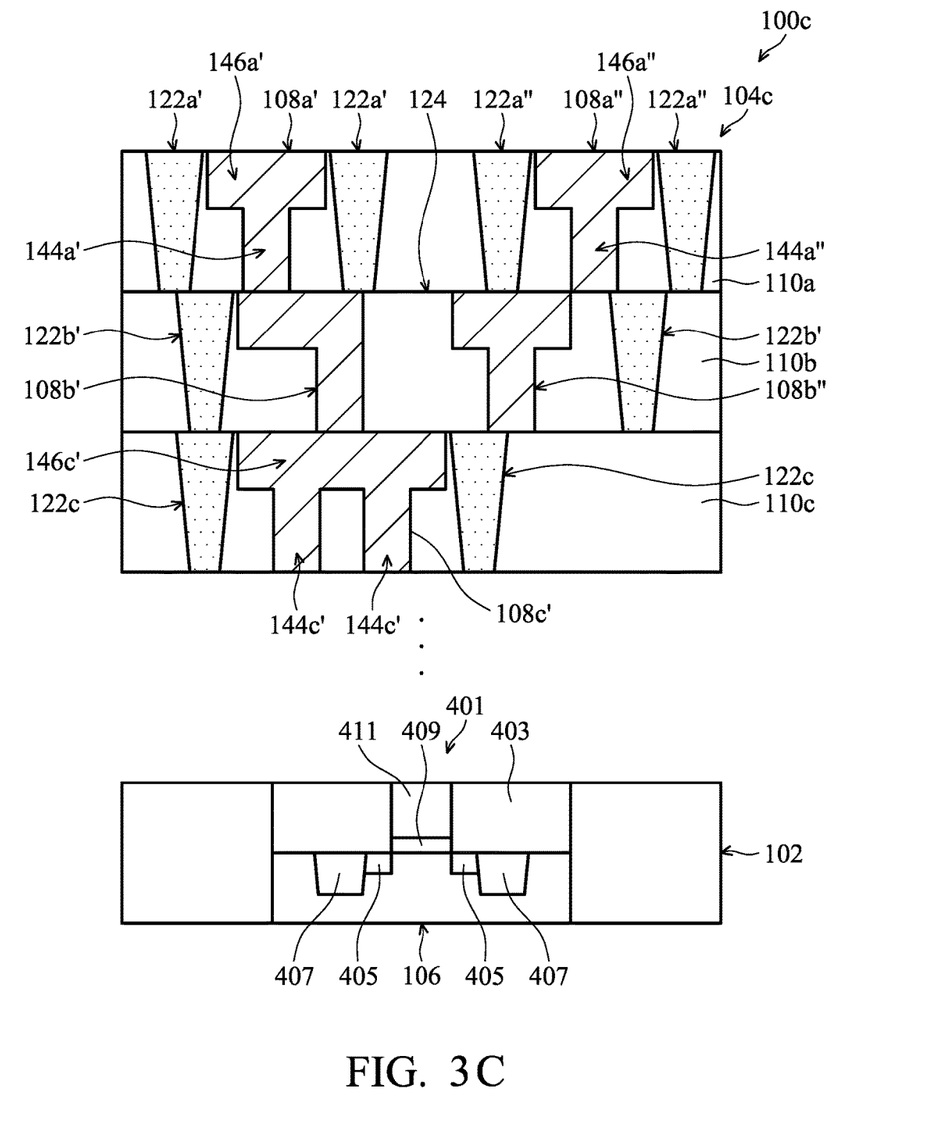

FIG. 3C illustrates a cross-sectional representation of a semiconductor device structure 100c in accordance with some embodiments. Semiconductor device structure 100c also includes gate structure 401 formed in device region 106 of substrate 102, similar to that of semiconductor device structure 100a or 100b.

In addition, conductive features 108a' and 108a" are formed in dielectric layer 110a in accordance with some embodiments. Conductive feature 108a' is surrounded by a stress-reducing structure 122a', and conductive feature 108a" is surrounded by a stress-reducing structure 122a". As shown in FIG. 3C, conductive feature 108a' includes one metal line 146a' and one via 144a' connected with metal line 146a'. In addition, conductive feature 108a" includes one metal line 146a" and one via 144a" connected with metal line 146a". Moreover, in some embodiments, the edges of conductive feature 108a" are in direct contact with stress-reducing structure 122a", as shown in FIG. 3C in accordance with some embodiments.

Furthermore, conductive features 108b' and 108b" are formed in dielectric layer 110b, and conductive feature 108c' is formed in dielectric layer 110c in accordance with some embodiments. As shown in FIG. 3C, conductive features 108b' and 108b" are both formed in portion 124 which is surrounded by a stress-reducing structure 122b'. Therefore, conductive features 108b' and 108b" are both protected by stress-reducing structure 122b'. Conductive feature 108c' includes one metal line 146c' and two vias 144c' connected with metal line 146c' and is protected by stress-reducing structure 122c'.

As shown in FIG. 3C, conductive features, such as conductive features 108a', 108a", 108b', 108b", and 108c', with different shapes and sizes can be formed in interconnect structure 104c. Accordingly, the application of stress-reducing structure, such as stress-reducing structure 122a', 122a", 122b', and 122c, may also be varied, and the scope of the disclosure is not intended to be limiting.

As described previously, when a conductive feature is unprotected, stress caused by dielectric layer surrounding the conductive feature will induce or impart undesired forces, such as pulling forces, on the conductive feature and will affect the performance of devices formed under conductive feature 108. For example, the electron mobility of the devices may be altered and the devices may have poor current uniformity. Therefore, in various embodiments, the stress-reducing structure, such as stress-reducing structure 122, is formed to protect the conductive features, such as conductive feature 108. As shown in FIG. 1N, conductive feature 108 is formed in portion 124 of dielectric layer 110. Accordingly, conductive feature 108 is surrounded, and protected, by stress-reducing structure 122, and the performance of the devices formed in device region 106 under conductive feature 108 is not affected by stress 112.

Embodiments of mechanisms for a semiconductor device structure are provided. The semiconductor device structure includes a conductive feature formed in a dielectric layer. In addition, the conductive feature is surrounded by a stress-reducing structure (e.g. a guard ring) formed in the dielectric layer. The stress-reducing structure is configured to protect the conductive feature from the stress forces caused by the dielectric layer outside the stress-reducing structure. Therefore, the performance of the devices formed below the conductive feature will not be affected by the stress forces.

In some embodiments, a method for manufacturing a semiconductor structure is provided. The method for manufacturing a semiconductor structure includes forming a dielectric layer over a substrate and forming a first structure through the dielectric layer such that a first portion of the dielectric layer is disposed in between the first structure. The method for manufacturing a semiconductor structure further includes forming a first via hole and a second via hole through the first portion of the dielectric layer and forming a trench connecting the first via hole and the second via hole in the dielectric layer. The method for manufacturing a semiconductor structure further includes forming a conductive feature in the first via hole, the second via hole, and the trench. In addition, the first structure and the dielectric layer are made of different materials from each other.

In some embodiments, a method for manufacturing a semiconductor structure is provided. The method for manufacturing a semiconductor structure includes forming a dielectric layer over a substrate and forming a first resist layer over the dielectric layer, wherein the first resist layer has a first opening. The method for manufacturing a semiconductor structure further includes etching the dielectric layer through the first opening of the first resist layer to form a first trench and filling the first trench with a stress-relieving material. The method for manufacturing a semiconductor structure further includes forming a conductive feature through the dielectric layer surrounding by the stress-relieving material.

In some embodiments, a semiconductor device structure is provided. The semiconductor structure includes a first dielectric layer formed over a substrate and a first stress-relieving structure formed in the first dielectric layer to surround a first portion of the first dielectric layer. The semiconductor structure includes a first conductive structure formed in the first portion of the first dielectric layer and a second dielectric layer formed over the first dielectric layer. The semiconductor structure also includes a second stress-relieving structure formed in the second dielectric layer to surround a second portion of the second dielectric layer and a second conductive structure formed in the second portion of the second dielectric layer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a semiconductor structure, comprising:
    forming a dielectric layer over a substrate;
    forming a first structure through the dielectric layer such that a first portion of the dielectric layer is disposed in between the first structure;
    forming a first via hole and a second via hole through the first portion of the dielectric layer;
    forming a trench connecting the first via hole and the second via hole in the dielectric layer; and
    forming a conductive feature in the first via hole, the second via hole, and the trench,
    wherein the first structure and the dielectric layer are made of different materials from each other.

2. The method for manufacturing the semiconductor structure as claimed in claim 1, further comprising:
    forming a resist layer over the dielectric layer, wherein a portion of the resist layer fills in the first via hole and the second via hole;
    forming an opening in the resist layer over the first via hole, the second via hole, and a portion of the dielectric layer located between the first via hole and the second via hole;
    etching the resist layer in the first via hole and in the second via hole and etching the portion of the dielectric layer located between the first via hole and the second via hole to form the trench; and
    removing the resist layer.

3. The method for manufacturing the semiconductor structure as claimed in claim 1, wherein a top surface of the first structure is substantially level with a top surface of the conductive feature, and a bottom surface of the first structure is substantially level with a bottom surface of the conductive feature.

4. The method for manufacturing the semiconductor structure as claimed in claim 1, wherein the first structure is made of a compressive material and the dielectric layer is made of a tensile material.

5. The method for manufacturing the semiconductor structure as claimed in claim 1, wherein the first structure is configured to prevent stress created by the dielectric layer outside the first structure from directly entering the first portion of the dielectric layer.

6. The method for manufacturing the semiconductor structure as claimed in claim 1, wherein forming the first structure through the dielectric layer comprises:
    forming a trench in the dielectric layer surrounding the first portion of the dielectric layer; and
    forming a stress-relieving material in the trench.

7. The method for manufacturing the semiconductor structure as claimed in claim 6, wherein the first portion of the dielectric layer is enclosed by the trench.

8. A method for manufacturing a semiconductor structure, comprising:
    forming a dielectric layer over a substrate;
    forming a first resist layer over the dielectric layer, wherein the first resist layer has a first opening;
    etching the dielectric layer through the first opening of the first resist layer to form a first trench;
    filling the first trench with a stress-relieving material; and
    forming a conductive feature through the dielectric layer surrounding by the stress-relieving material.

9. The method for manufacturing the semiconductor structure as claimed in claim 8, wherein forming the conductive feature comprises:
    forming a second resist layer having a second opening over the dielectric layer after the stress-relieving material is formed;
    etching the dielectric layer through the second opening of the second resist layer to form a via hole;
    removing the second resist layer; and
    forming a third resist layer in the via hole.

10. The method for manufacturing the semiconductor structure as claimed in claim 9, wherein forming the conductive feature further comprises:
    removing a top portion of the third resist layer in the via hole and a portion of the dielectric layer to form a second trench over the via hole;
    removing the third resist layer; and
    filing the via hole and the trench to form the conductive feature.

11. The method for manufacturing the semiconductor structure as claimed in claim 8, wherein the dielectric layer is made of a material different from the stress-relieving material.

12. The method for manufacturing the semiconductor structure as claimed in claim 11, wherein the dielectric layer is made of a tensile material.

13. The method for manufacturing the semiconductor structure as claimed in claim 8, further comprising:
    forming a gate structure in the substrate,
    wherein the conductive feature is formed directly above the gate structure.

14. A semiconductor structure, comprising:
    a first dielectric layer formed over a substrate;
    a first stress-relieving structure formed in the first dielectric layer to surround a first portion of the first dielectric layer;
    a first conductive structure formed in the first portion of the first dielectric layer;
    a second dielectric layer formed over the first dielectric layer;
    a second stress-relieving structure formed in the second dielectric layer to surround a second portion of the second dielectric layer; and
    a second conductive structure formed in the second portion of the second dielectric layer.

15. The semiconductor device structure as claimed in claim 14, wherein the first stress-relieving structure and the second stress-relieving structure are made of the same material.

16. The semiconductor structure as claimed in claim 14, wherein the first stress-relieving structure partially overlaps with the second stress-relieving structure.

17. The semiconductor structure as claimed in claim 14, wherein the first conductive feature is electrically connected with the second conductive feature.

18. The semiconductor structure as claimed in claim 14, further comprising:
- a third dielectric layer formed over the second dielectric layer;
- a third stress-relieving structure formed in the third dielectric layer to surround a third portion of the third dielectric layer; and
- a third conductive structure formed in the third portion of the third dielectric layer.

19. The semiconductor structure as claimed in claim 18, further comprising:
- a fourth stress-relieving structure formed in the third dielectric layer to surround a fourth portion of the first dielectric layer; and
- a fourth conductive structure formed in the fourth portion of the third dielectric layer.

20. The semiconductor structure as claimed in claim 19, wherein the first stress-relieving structure, the second stress-relieving structure, the third stress-relieving structure, and the fourth stress-relieving structure are made of the same material.

* * * * *